United States Patent [19]
Lau et al.

[11] Patent Number: 5,656,931
[45] Date of Patent: Aug. 12, 1997

[54] FAULT CURRENT SENSOR DEVICE WITH RADIO TRANSCEIVER

[75] Inventors: Ken Lau, San Francisco; Jimmie Yee; Rodger Mayeda, both of Danville; Julian Riccomini, Pleasanton; Mary Ilyin, Walnut Creek, all of Calif.

[73] Assignee: Pacific Gas and Electric Company, San Francisco, Calif.

[21] Appl. No.: 376,145

[22] Filed: Jan. 20, 1995

[51] Int. Cl.$^6$ .................................................. G01R 31/02
[52] U.S. Cl. .......................... 324/522; 324/771; 340/664; 361/96
[58] Field of Search .............................. 324/500, 522, 324/543, 771; 340/635, 652, 664; 361/29, 96, 115

[56] References Cited

U.S. PATENT DOCUMENTS

| | | | |
|---|---|---|---|
| 3,863,187 | 1/1975 | Mahieu et al. | 337/162 |
| 4,314,199 | 2/1982 | Yamaura et al. | 324/521 |
| 4,362,986 | 12/1982 | Burke et al. | 324/500 |
| 4,442,472 | 4/1984 | Pang et al. | 361/96 |
| 4,801,937 | 1/1989 | Fernandes | 340/870.16 |
| 4,829,298 | 5/1989 | Fernandes | 340/870.27 |
| 5,140,257 | 8/1992 | Davis | 324/106 |
| 5,485,093 | 1/1996 | Russell et al. | 324/522 |
| 5,512,832 | 4/1996 | Russell et al. | 324/522 |
| 5,550,476 | 8/1996 | Lau et al. | 324/522 |
| 5,565,783 | 10/1996 | Lau et al. | 324/522 |

*Primary Examiner*—Kenneth A. Wieder
*Assistant Examiner*—Glenn W. Brown
*Attorney, Agent, or Firm*—Burns, Doane, Swecker and Mathis LLP

[57] ABSTRACT

A fault current sensor device detects and distinguishes abnormal current events on alternating current overhead and underground power transmission lines. The sensor distinguishes whether the momentary or sustained fault is a line-to-ground fault, line-to-line fault or a three-phase fault. The sensor determines whether the overload has occurred on all three phases, or only on one or two phases, of the power line in an unbalanced situation. The device can be remotely reprogrammed to alter its trigger or threshold level and can be remotely reset after a fault has occurred.

1 Claim, 10 Drawing Sheets

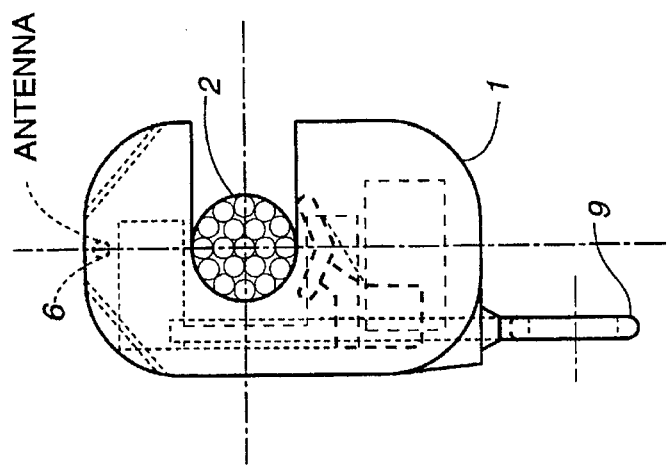
FIG._2
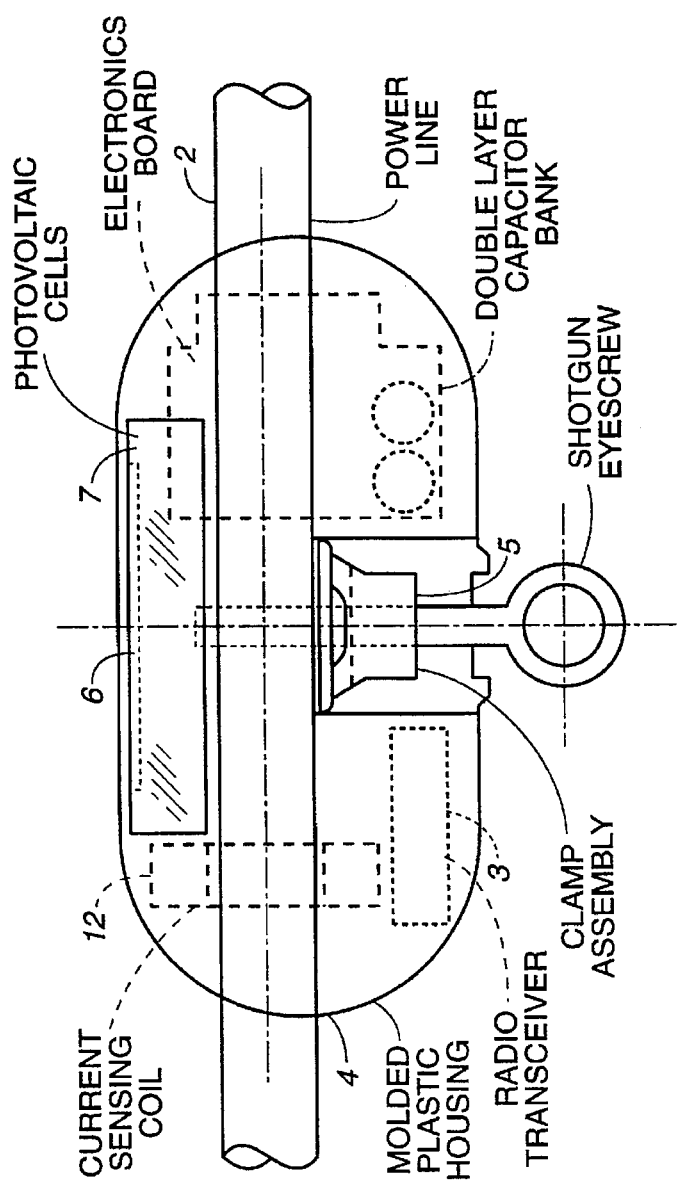
FIG._1

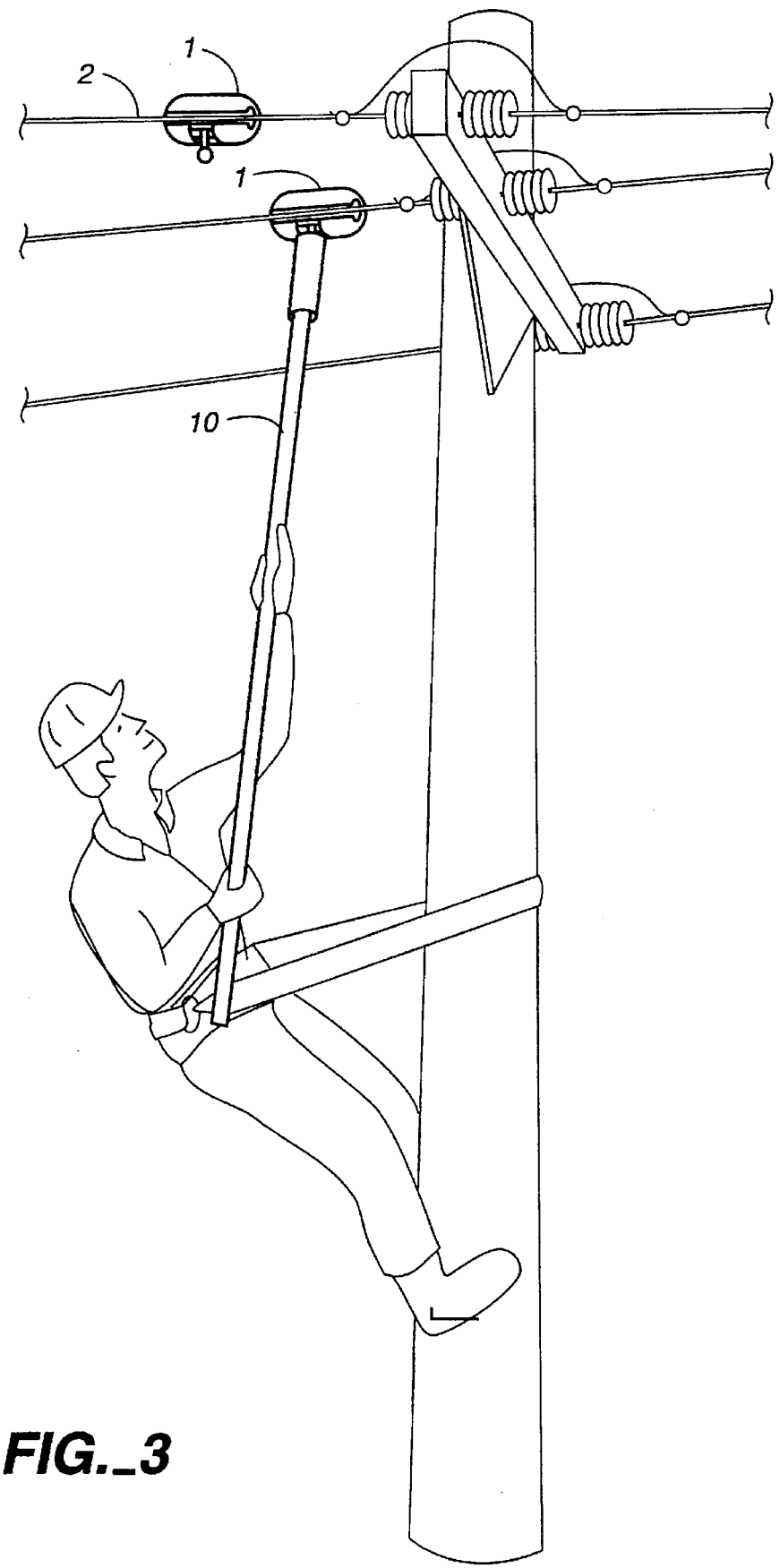
FIG._3

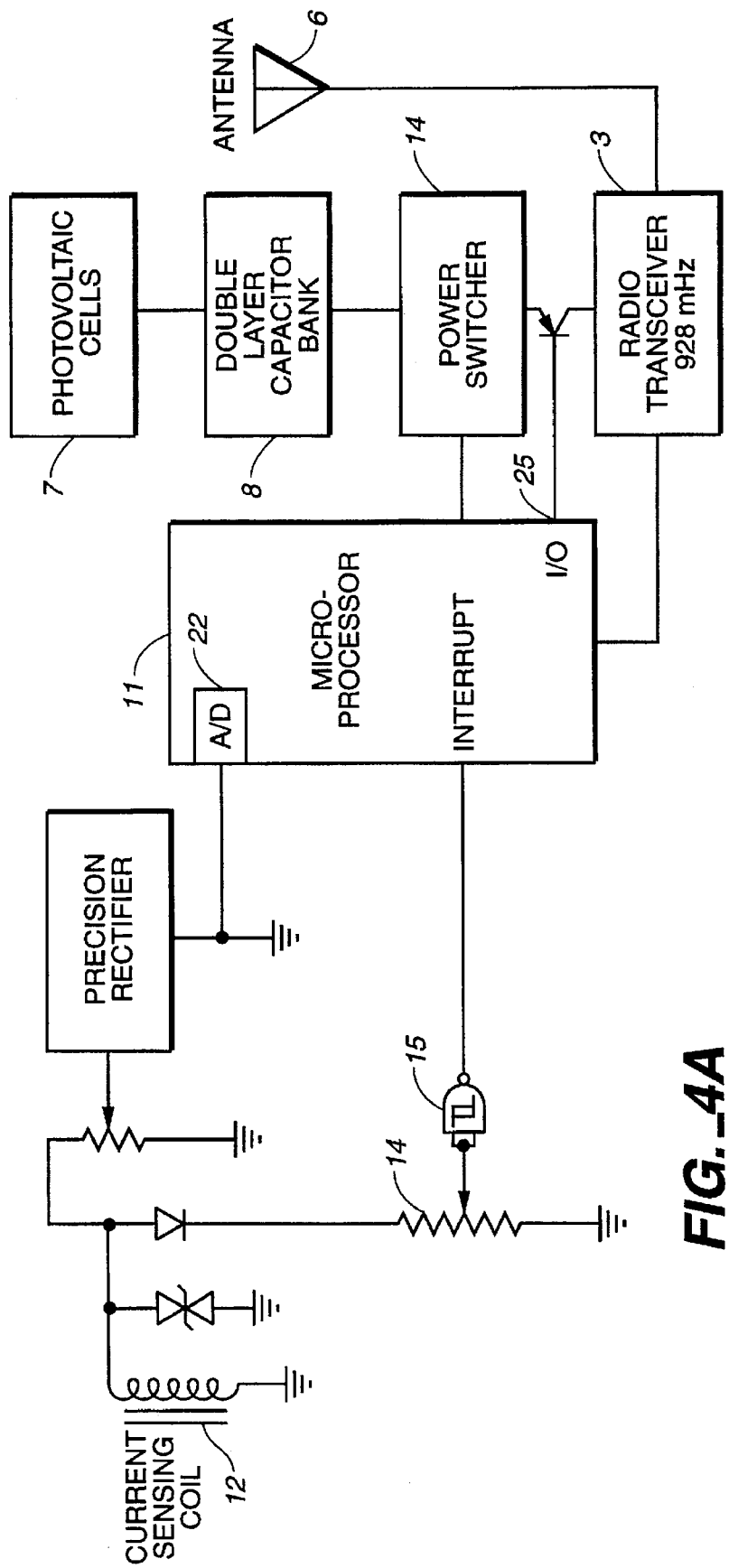
FIG._4A

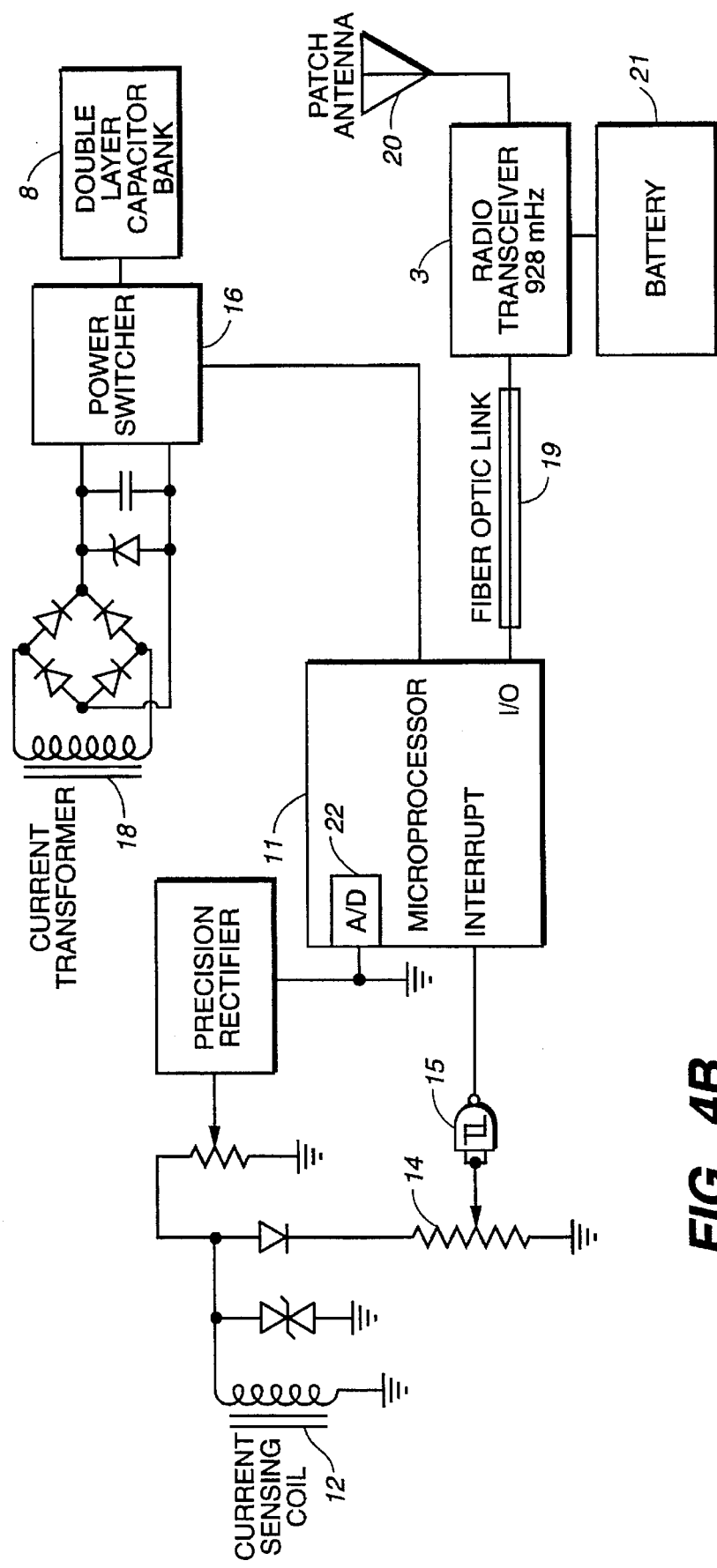
FIG._4B

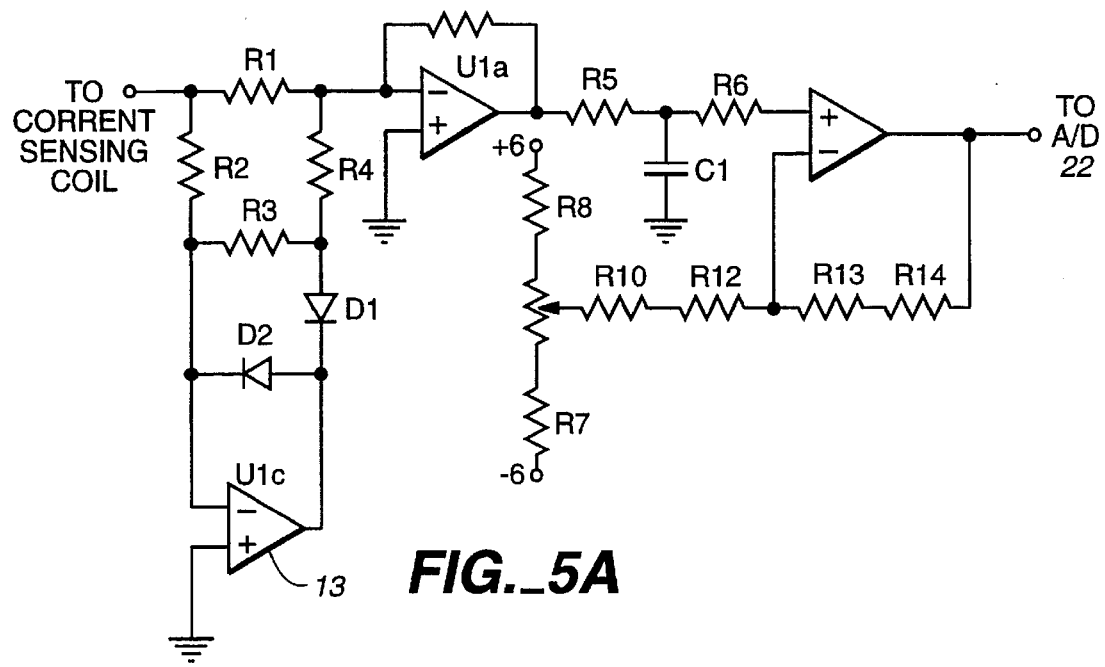
FIG._5A
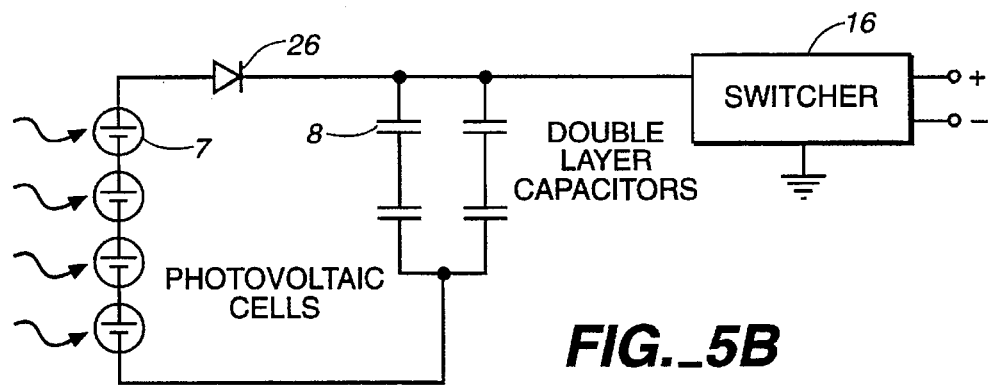
FIG._5B
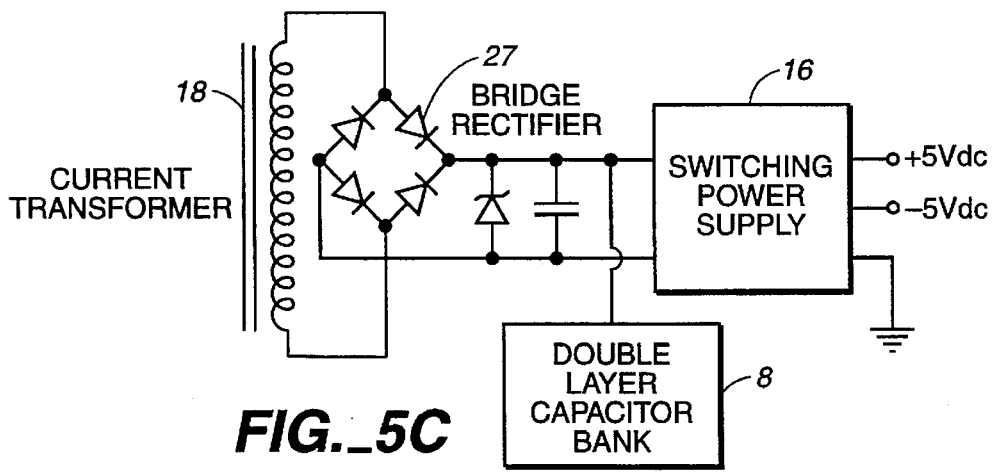
FIG._5C

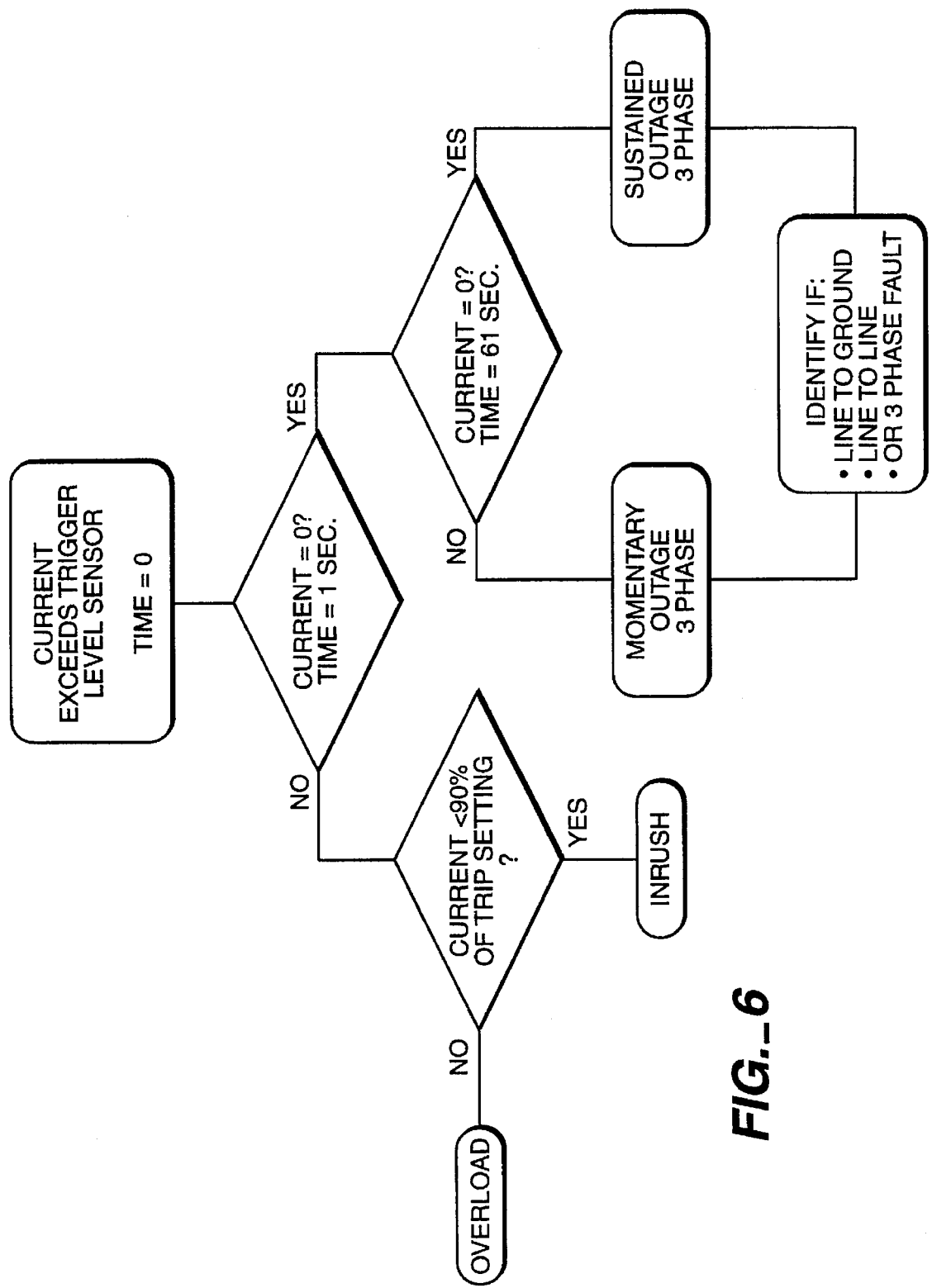
FIG._6

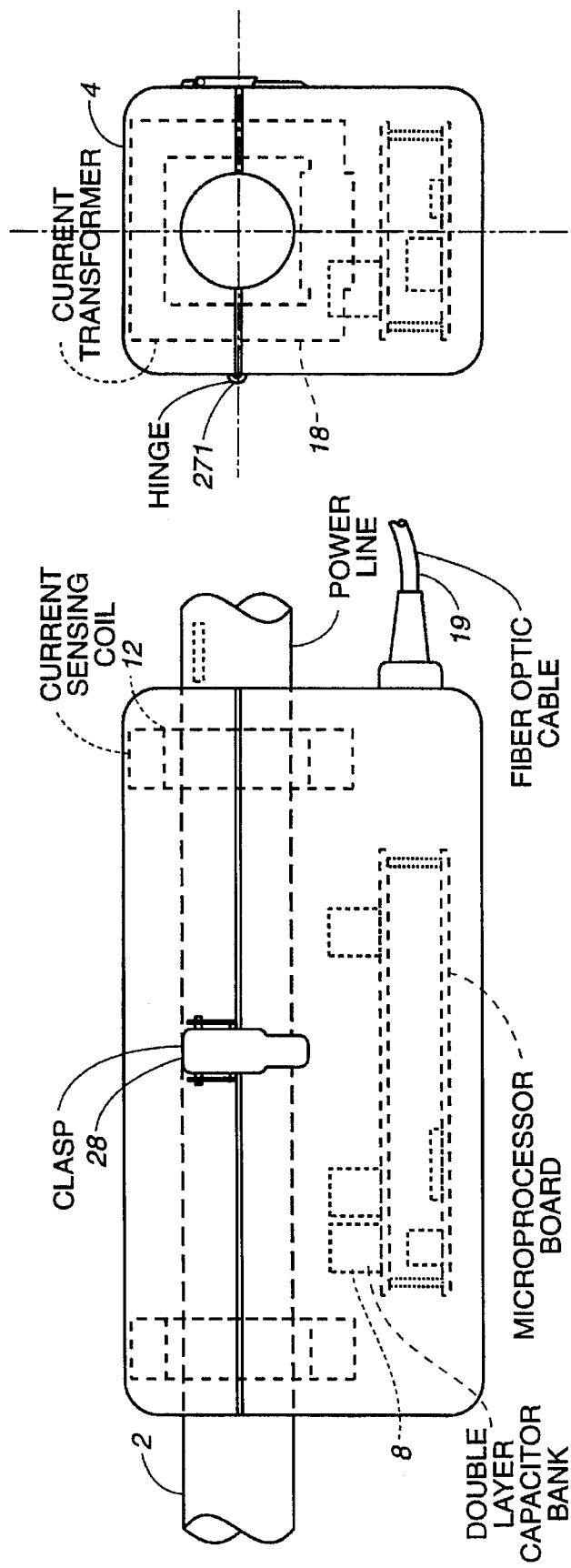

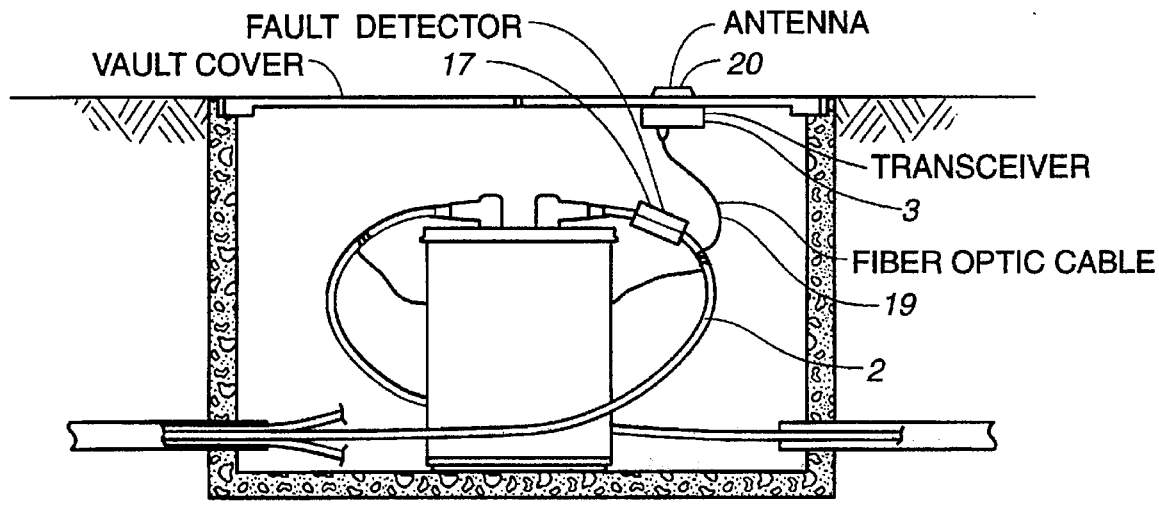
FIG._7C
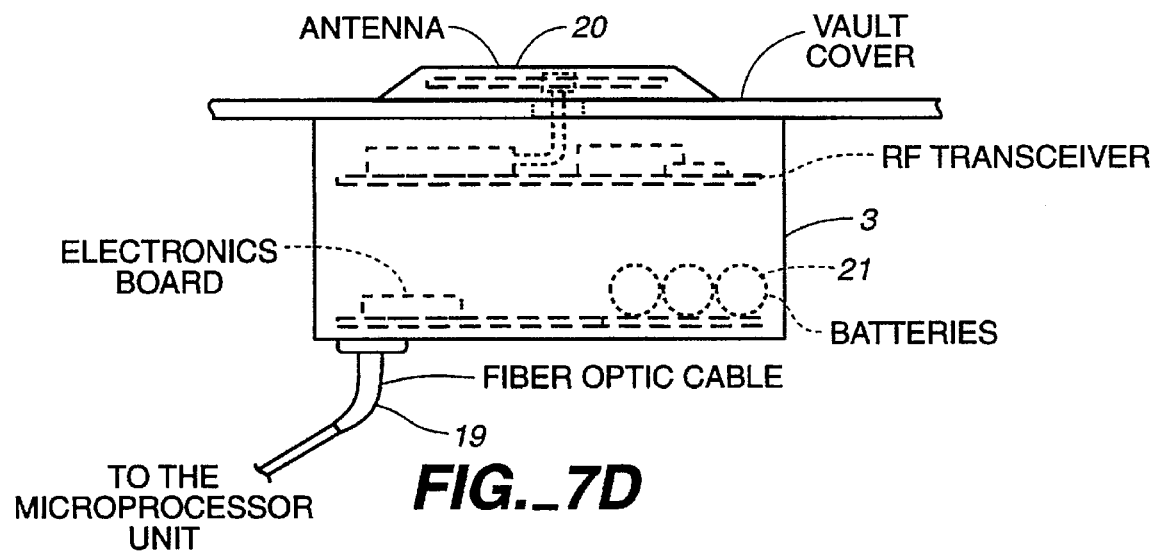
FIG._7D
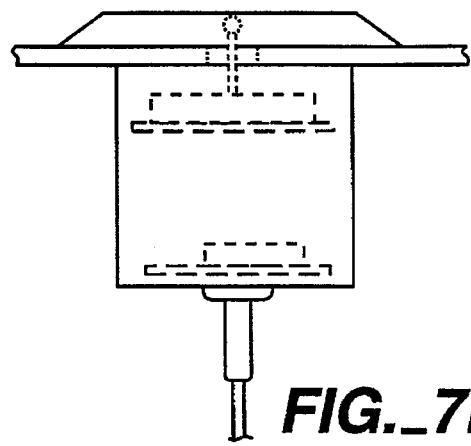
FIG._7E

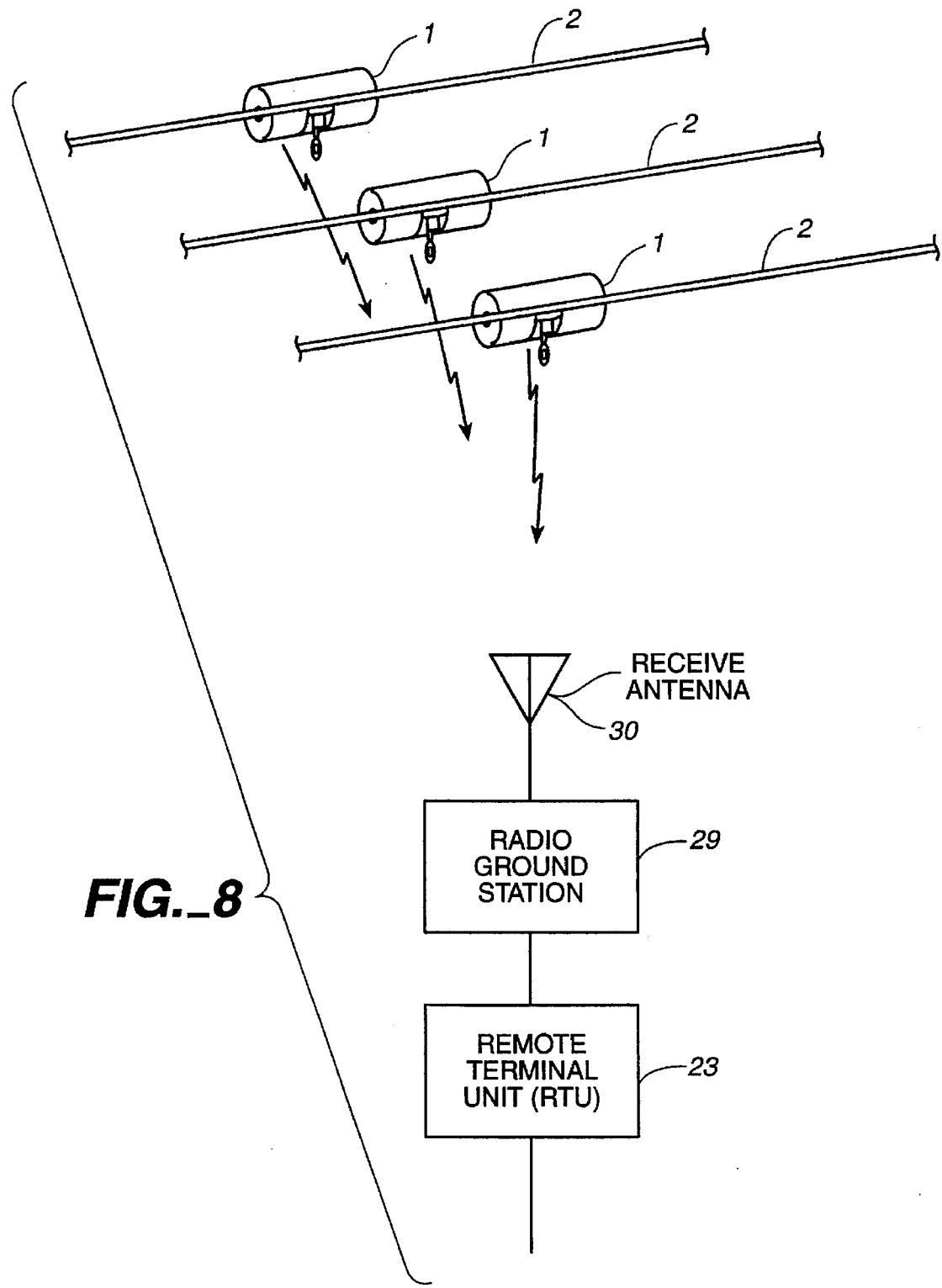
FIG._8

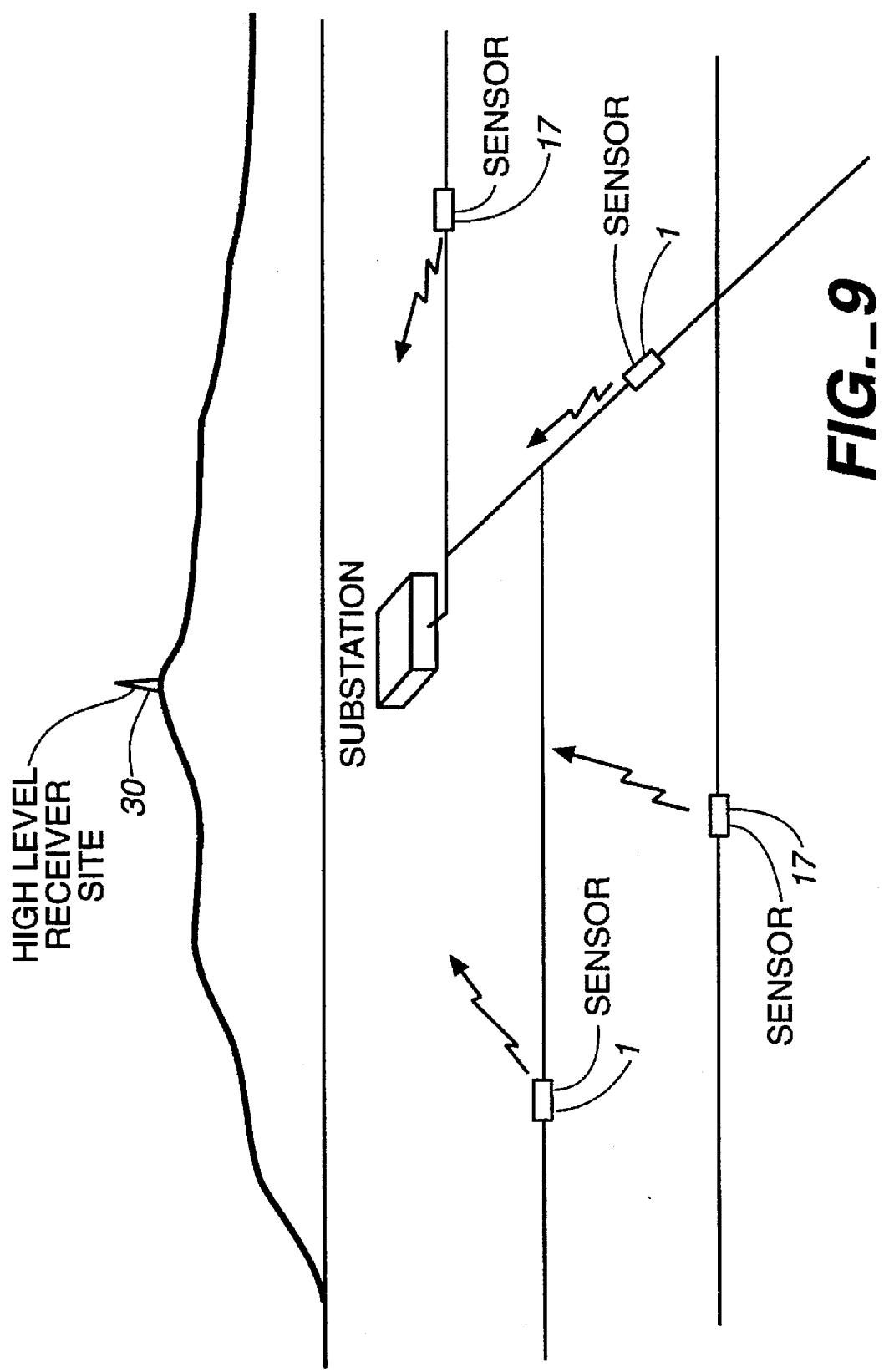
FIG._9

FAULT CURRENT SENSOR DEVICE WITH RADIO TRANSCEIVER

BACKGROUND OF THE INVENTION

1. Field of the Invention

The present invention relates to power transmission and distribution systems, more particularly to devices for detecting and transmitting fault current information from power transmission and distribution lines to a control center, switching center or other designated ground station.

2. State of the Art

In the field of power transmission and distribution, generating systems produce electrical power which is transmitted through a grid of electrical high voltage alternating-current (AC), three-phase power lines. Occasionally, a transmission or distribution power line experiences a fault in which, for example, a short circuit or equipment failure on a power line causes a circuit breaker to trip open, causing a power interruption to the customer. Early detection and characterization of these faults in an electrical power transmission and distribution system are essential to a quick resolution of the problem and to future planning of upgrades to the power transmission and distribution system.

Prior art fault sensors or devices can only sense and record abnormal current that causes a sustained outage. Most often the device needs to be manually reset at the device's location. In addition, these prior art devices are not provided with data transmission capability. To identify the power line section with a fault, each prior art device needs to be visually inspected, which often takes hours to complete and prolongs outage time for the affected customers.

Retaining sensor integrity over the life of the sensor is key to minimizing operation and maintenance cost. In the prior art, in order to monitor line current and transmit information relating to the faults occurring on a transmission or distribution line, batteries were needed to power a microprocessor and transmitter. The problem arises with such prior art devices that the batteries became exhausted over a period of time and require replacement or recharging. To manage such battery maintenance and/or replacement at thousands of remote sensing locations has involved considerable expense and has often resulted in a failure to detect faults over significant periods of time.

Other prior art devices mounted on an overhead transmission or distribution line derive power by utilizing the energy stored in the magnetic field surrounding the operating conductor. At locations such as near the end of a distribution line, the load current may be at such a low level that there is not enough energy to power the fault sensor. Such prior art devices utilize a magnetic iron collar surrounding the transmission or distribution line for extracting the magnetic field energy as shown in U.S. Pat. Nos. 4,635,055, 4,728,887 and 4,808,917. These collar devices are relatively bulky, expensive, heavy and difficult to install. Moreover, for satisfactory operation, it is necessary for the iron magnetic collar to be completely closed around the conductor without any gap, to provide flux continuity around the transmission line. This closed collar arrangement is necessary both in order to derive adequate power and also to isolate the measurement of current from the effect of other nearby conductors. Such closed iron core clamp devices are heavy and difficult to install, requiring special tools and in some cases two workers.

Another problem with the prior art fault sensors is that they are not remotely programmable. Thus, programming instructions and/or calibrations made prior to installation cannot be changed without retrieving or removing the device from the power line.

It is therefore one object of the present invention to provide a sensing device that can be attached to a transmission or distribution power line and which will sense and transmit at least one alarm condition using circuitry which is operated by power not dependent on power flowing in the overhead transmission or distribution power line.

Another object of the invention is to provide an overhead sensing device for a power line that can be attached to an overhead power line by a simple clamp on a shotgun hot stick, measure at least one power line operating characteristics, and transmit any fault information and/or alarm condition to a designated ground station using a transceiver powered by a bank of double-layer capacitors.

Another object of the invention is to provide an underground sensing device that can be clamped on the power line and that can measure at least one operating characteristic and then transmit any fault information and/or alarm condition to a designated ground station using a transceiver and a fiber optic link.

Another object of the invention is to provide a sensing device for an overhead power line that can be completely controlled or programmed by communication signals from the ground using a transceiver provided within the device.

Another object of the invention is to provide a compact, lightweight sensing device for an overhead power line that can be easily attached and removed from a power line and measure at least one of its operating characteristics.

Still another object of the invention is to provide a sensing device for a power line that can be attached to a power line for measuring at least one of its operating characteristics and that is particularly well adapted for economy of manufacture.

SUMMARY OF THE INVENTION

The aforesaid and other objects of the invention are accomplished by the sensing device of the present invention. The sensing device may be either an overhead or underground sensing device. The overhead sensing device is comprised of an elongated housing formed from extruded or otherwise processed plastic. Fixed to the housing is a clamp assembly having a jaw portion adapted to extend at least partially around the circumference of a power line and compatible with standard industry installation tools. The sensing device can detect and distinguish between various types of faults on transmission and distribution lines, preferably including momentary outage, sustained outage, normal overload, or inrush. The device only monitors current when a fault occurs. A pickup current sensing coil is housed at a fixed distance from the power line and measures the magnetic field strength at that point, which is proportional to the power line current. When a fault current event is detected, the signal is sent through a diode and then on to a microprocessor situated within the housing. The signal is processed by the microprocessor, which distinguishes which type of fault current has occurred. Information concerning the type of fault current is transmitted by a transceiver connected to an antenna within the housing in the overhead sensor device.

In an underground sensor device, the antenna is located on an equipment vault and is connected to the sensor device by a fiber optic link. Signals from the sensor are transmitted via the antenna and received and processed by monitoring equipment at a remotely located ground station.

If the device has alarmed because of fault current conditions, then when normal current levels return the device can reset itself immediately or reset itself after a predetermined period of time, or be reset remotely from an operating center or designated ground station. Power for activating the sensor circuitry and for processing and transmitting related signals is furnished by a bank of double-layer capacitors (which have typical values greater than one farad). This bank is recharged by photovoltaic cells attached to the outer surface of the overhead sensor device or by a current transformer surrounding the underground power line.

Central circuitry for the transceiver circuit includes a microprocessor which can be initially programmed to provide trigger and threshold levels. The microprocessor can also be controlled from the remote ground station to alter the operating program of the device if different levels are desired. A time delay for resetting the device can also be reprogrammed remotely.

An important feature of the invention is the provision of a wakeup circuit for detecting the occurrance of a fault condition and generating in response thereto a wakeup signal. The microprocessor is responsive to the wakeup signal for exiting a sleep mode and is responsive to a sensor-derived digital signal for detecting an abnormal condition and thereafter distinguishing whether any of a number of different types of faults has occurred. Since the device is in sleep mode a preponderance of the time, power requirements are minimized.

With the information provided by the device, operators can respond to faults promptly and appropriately. For a sustained alarm, operators may choose to isolate the affected section and perform load switching to restore service to affected customers; for an overload alarm, operators may execute load transfers to relieve the overloaded line section; for a momentary outage alarm, operators may dispatch line patrolmen to identify the possible cause of the trouble, such as tree branches getting too close to the power line, and schedule a maintenance crew to correct the problem; for an inrush alarm, operators may refer the problem to engineers, who may then devise remedial action to correct the deficiency.

BRIEF DESCRIPTION OF THE DRAWING

The present invention may be further understood from the following description in conjunction with the appending drawing. In the drawing:

FIG. 1 is a front elevational view of an overhead fault sensor, in accordance with one embodiment of the invention, mounted on a power line;

FIG. 2 is a view in end elevation of the overhead fault sensor device of FIG. 1;

FIG. 3 is an illustration of the overhead fault sensor being mounted on a power line;

FIG. 4A is a block diagram of the principal components of the overhead fault sensor of FIG. 1;

FIG. 4B is a block diagram of the principal components of an underground fault sensor;

FIG. 5A is a schematic diagram of the precision rectifier of the current sensing means of the invention;

FIG. 5B is a schematic of a power supply and a rechargeable power backup system of the overhead fault sensor;

FIG. 5C is a schematic of a power supply and a rechargeable power backup system of the underground fault sensor;

FIG. 6 is a flow chart illustrating a logic flow of the fault sensing device used to distinguish between various fault conditions;

FIG. 7A is a front elevational view of an underground fault sensor, in accordance with another embodiment of the invention;

FIG. 7B is a view in end elevation of the overhead fault sensor device of FIG. 7A;

FIG. 7C is an illustration of the underground fault sensor in a vault;

FIG. 7D is a front elevational view of a transceiver portion of the underground fault sensor;

FIG. 7E is a view in end elevation of the transceiver portion of the underground fault sensor;

FIG. 8 is an illustration of the multiple fault sensors in remote communication with a ground station; and FIG. 9 is a block diagram of a fault sensor monitoring system in accordance with the present invention.

DETAILED DESCRIPTION OF THE PREFERRED EMBODIMENTS

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

With reference to the drawings, FIG. 1 and FIG. 2 show an overhead fault sensor device 1 embodying principles of the present invention as the fault sensor device appears in a typical installation when attached to an overhead power line 2. When in use the device will detect occurrence of, distinguish and transmit information concerning an alarm condition. The device senses line current under microprocessor control in a manner later described in relation to FIG. 4A, FIG. 4B, FIG. 5A, FIG. 5B and FIG. 5C.

A sensor identification number is preprogrammed into the sensor. This identification number and alarm condition information are transmitted in real time by a radio transceiver 3 so that the data can be received, recorded and processed at a remote designated ground station 29 such as a control center. The ground station may be equipped with suitable data receiving and storage equipment for monitoring a collection of sensor devices attached to different transmission and distribution power lines at various distances, as well as means for sending signals back to each sensor device for reprogramming it or otherwise controlling its operation.

In broad terms, the overhead sensor device, as shown in FIG. 1 and FIG. 2, is comprised of an elongated housing 4 within which is contained electronic circuitry required for its operation. The housing is made of molded or extruded plastic which is ultraviolet resistant, such as ABS plastic. A clamp assembly 5 is centrally located for holding the device firmly to an overhead power line 2. A dipole antenna 6 is located just under the surface of the housing for sending via RF radio signals data obtained by the sensors of the device concerning faults and power line characteristics and for receiving control or reprogramming signals sent back to the device from the remote ground monitoring and control station 29 or other ground station. Power for operating the fault sensor is supplied by two panels of photovoltaic cells 7 attached to the outer surface of the housing and wired so as to charge a bank of double-layer capacitors 8 within the housing.

The clamp assembly 5 consists of the housing frame, a lower jaw and an eyescrew 9. As shown in FIG. 1, the lower jaw of the clamp assembly 5, preferably made of metal, moves as the eyescrew 9 is turned to clamp on to the overhead power line 2. Threads provided in the plastic housing for the eyescrew are also metal. The length of the screw and size of the lower jaw of the clamp assembly 5 allow gripping various diameters of overhead power lines. A lock washer allows the lower jaw of the clamp assembly 5 to remain firmly attached to the overhead power line 2.

As shown in FIG. 1 and FIG. 2, the equipment within the sensing device is primarily molded to the housing 4. A pickup current coil 12 is molded at a precise location in the housing 4. A microprocessor 11 is shielded by a metal foil and then molded into the housing 4. The transceiver 3 is also molded inside. The two panels of photovoltaic cells 7 are bonded to the housing 4. The clamp assembly 5 is molded into the housing 4.

As shown in FIG. 3, the fault sensor is mounted on an energized overhead power line easily and quickly by means of a so-called "hot stick" 10 manipulated by an individual on the ground, in a bucket track, or from a power line pole. The hot stick 10 includes a "shotgun" internal attachment mechanism which attaches to the eyescrew 9 of the overhead fault sensor 1. To attach the overhead fault sensor 1, the hot stick 10 is attached first to the sensor. Then the sensor is mounted on the overhead power line 2 and the handle of the hot stick 10 is turned, thereby attaching the device to the overhead power line 2. When the overhead device 1 has been mounted, the shotgun internal attachment mechanism is deactivated and the hot stick 10 is detached from the device. Reinserting the hot stick and turning it in the opposite direction will open the clamp assembly 5 and allow the overhead fault sensor 1 to be removed from the overhead transmission or distribution power line 2. This attachment and removal feature provides flexibility and efficiency in placing the fault sensors in the transmission and distribution system.

Referring to FIG. 4A, a block diagram for the overhead fault sensor is shown. Upon the occurence of a power line fault, a current is generated from the current sensing coil 12 across a resistor 14. This signal is sufficient enough to toggle the CMOS Schmitt trigger NAND gate 15 from a logic high state to a logic low state. This change in logic state generates an interrupt or wakeup signal to the microprocessor 11. The microprocessor 11 awakens, powers the electronics and begins sampling the current value, through the precision rectifier 13. The microprocessor 11 is programmed to follow a logic flow chart to be described in relation to FIG. 6. A power switcher 16 takes the voltage from the bank of double-layer capacitors 8 and regulates it to a set voltage for the microprocessor 11 and to a prescribed voltage range for the analog circuitry. The double-layer capacitor banks 8 are charged by photovoltaic cells 7. When the type of fault is distinguished, then the radio transceiver 3 sends the sensor identification number and event information to a load center or any other designated ground station via the antenna 6.

Referring to FIG. 4B, a block diagram for the underground fault sensor 17 is shown. Upon the occurence of a power line fault, a current is generated from the current sensing coil 12 across a resistor 14. This signal is sufficient enough to toggle the CMOS Schmitt trigger NAND gate 15 from a logic high state to a logic low state. This change in logic state generates an interrupt or wakeup signal to the microprocessor 11. The microprocessor 11 awakens, powers the electronics and begins sampling the current value through the precision rectifier 13. The microprocessor 11 is programmed to follow a logic flow chart to be described in relation to FIG. 6. The power switcher 16 takes the voltage from the bank of double-layer capacitors 8 and regulates it to five volts for the microprocessor 11. The double-layer capacitor bank 8 is powered by a current transformer 18 which is clamped around the underground power line 2. When the type of fault is distinguished, then the microprocessor 11 sends the sensor identification number and event information through a fiber optic link 19 to a transceiver 3 which has a patch antenna 20. The radio transceiver 3 is powered by a battery 21. The signal is then sent to a load center or any other designated ground station.

With reference to FIG. 4A, FIG. 4B, and FIG. 5A, the fault sensor device's electronics include a microprocessor 11, RAM, I/O circuitry, bipolar voltage limiter, timer components, an A/D converter 22, capacitors, a CMOS Schmitt trigger NAND gate 15 and a precision rectifier 13. Sampled values of the monitored parameters are digitized by the A/D converter 22, stored in RAM, processed by the microprocessor 11 in accordance with instructions stored within an EEPROM board, and then sent over an eight-byte databus to a parallel spread-spectrum transceiver 3. The ground station at a designated location includes a microprocessor (similar to microprocessor 11) to which signals received from the devices are supplied for further processing, such as determining where the fault has occurred. Then the data are communicated to a central data receiving and control facility by a data link schematically indicated in FIG. 8, such as a Supervisory Control and Data Acquisition (SCADA) remote terminal unit (RTU) link 23 or radio. This aspect of the invention is described in greater detail below.

With reference to FIG. 4A and FIG. 5B, current flow through the power line is measured by a current sensing pickup coil 12 which is located at a fixed distance from the power line. A current is induced in the coil 12 by the magnetic fields of the power line 2. When a fault condition occurs, a current is generated from the current sensing coil 12 across the resistor 14. This toggles the CMOS Schmitt trigger NAND gate 15 from a logic high state to a logic low state which wakes up the microprocessor 11. The microprocessor 11 powers the electronics and takes a current value reading through the precision rectifier 13. The analog signal is fed into the A/D converter 22. The digitized signal is then sent to the microprocessor 11 for processing, and then the final information is sent on to the transceiver 3.

With reference to FIG. 5B and FIG. 4A, power to operate the overhead sensing device electronics and transceiver is derived from a bank of double-layer capacitors 8. The bank of double-layer capacitors 8 is charged by two panels of photovoltaic cells 7 mounted on the housing surface 4 of the overhead fault sensing device. The photovoltaic cell panels 7 are connected through a blocking diode 26. Each panel may consist of 21 cells in a series configuration, each cell being rated at 25 mA at 0.5V for total voltage of 10.5 volts. Such cells measuring 0.5×2.0 cm are commercially available. The photovoltaic cells 7 are connected to the bank of double-layer capacitors 8. The bank of double-layer capacitors 8 is connected to the power switcher 16. Another lead to the power switcher 16 connects to the microprocessor 11 and electronics.

Two leads from the precision rectifier 13 of the current sensor 12 connect to the A/D converter 22 on the microprocessor 11 (FIG. 4A). Both of these leads have a prescribed voltage signal range. From the power switcher 16 there are two leads. One is a lead through a transistor 24 which is switched off in the sleep mode until a fault condition has occurred or when there is a system functionality check. This lead is connected to both the radio transceiver 3 and an I/O port 25 of the microprocessor 11 through the transistor 24. The second lead provides power to the microprocessor 11.

Referring to FIG. 4B and FIG. 5C, power to operate the underground fault sensor 17 is derived from the bank of double-layer capacitors 8. The bank of double-layer capacitors 8 is charged by inductive power from current through the underground power line 2. When there is minimal underground power line current then the bank of double-layer capacitors 8 is used. A hinged current transformer 18 with the power line 2 forming the single turn primarily supplies all internal power to the underground fault sensing device 17. Current in the power line 2 induces voltage and current in the windings of the current transformer 18 which is rectified by a bridge rectifier 27 as further described in U.S. Pat. No. 4,886,980, incorporated herein by reference. The hinged current transformer 18 is connected to the bank of double-layer capacitors 8. The bank of double-layer capacitors 8 is connected to the power switcher 16. Another lead to the power switcher 16 goes to the microprocessor 11 and electronics. Two leads from the precision rectifier 13 of the current sensor 12 connect to the A/D converter 22 on the microprocessor 11. Both of these leads have a prescribed voltage range. From the power switcher 16 there is one lead which provides power to the microprocessor 11. The fiber optic link 19 from the microprocessor 11 is switched off in the sleep mode until a fault condition has occurred or when there is a system functionality check. This fiber optic link 19 is connected to the radio transceiver 3, which has a wakeup circuit. The radio transceiver 3 is powered by a battery 21.

Operation of the fault sensor when attached to a power line 2 being monitored in a typical installation may be described, relative to FIG. 4A and FIG. 4B, as follows.

The device is designed to activate the transceiver 3 when a fault occurs on the power line 2. During "sleep mode," power is not applied to any of the circuit elements except the CMOS Schmitt trigger NAND gate (which draws about 0.1 mA), and when a power-up signal is generated, all elements of the circuit (in particular the transceiver 3 and the microprocessor 11) are switched to an "on" condition. The transceiver 3 is also powered up at timed intervals to check the status and operability of the fault sensor device. During this time, reprogramming signals can be sent to the device from a controller, switching center or a ground station 29 at a designated location. In the underground fault sensor 17 the signals are sent to and from the microprocessor 11 through a fiber optic cable to and from the transceiver 3, which has a patch antenna 20 located on a vault (shown in greater detail in FIG. 7A and FIG. 7C.)

Referring to FIG. 6, the fault sensor activates when the power line current exceeds the trigger or threshold current setting of the current sensing coil 12 at time =0. The current sensor 12 waits for a second (time=1 second) to check whether the current goes to zero. If the current has gone to zero, then the monitored line has experienced an interruption or outage. The current sensor 12 waits for another 60 seconds (time=61 seconds) to check whether the current remains zero. If the current remains at zero, then the power line has experienced a sustained outage. If the current does not remain at zero, then the line has experienced a momentary interruption.

If only one phase senses the excessive current, the fault is a line-to-ground fault. If the sensors on two of the phases sense the high current, the fault is a line-to-line fault. If the sensors on all three phases sense the high current, the fault is a three-phase fault. This detective scheme is based on the operation of protective devices on power lines. When a protective device detects a fault condition on the power line, the protective device opens to de-energize the power line within one second and then typically recloses in 5 seconds to test the line to see if fault current condition still persists. This test is done to prevent unnecessary prolonged outages caused by events such as tree branches momentarily coming in contact with the power line. If the circuit test is successful, the circuit is reset back to normal. If the fault current condition persists, then the protective device will open to de-energize the line again. Typically, protective devices will test the circuit three times within a 30 second period. At the end of this period, if the fault current condition persists, the device will lock open to de-energize the circuit until the affected section is isolated.

Therefore, at time=1 second, if the line current does not go to zero, the power line has not experienced any interruption. At time=61 seconds, if the line current is less than 90% of the threshold setting of the current sensor, the power line has experienced an inrush current probably caused by the starting of a large motor. But at time=61 seconds, if the line current is greater than 90% of the threshold settings, the line is most likely overloaded.

With reference to FIG. 7A and FIG. 7B, the underground fault sensor device 17 is capable of sensing the current values with respect to the power line 2 upon which the sensor device is mounted. A current sensor of the type previously described in relation to FIG. 5A is incorporated in the underground fault sensor device 17. The power system of the underground fault sensor device, with its current transformer 18 and bank of double-layer capacitors 8, has been previously described in relation to FIG. 5C.

In broad terms, the underground sensor device 17 is comprised of an elongated housing 4 within which are contained elements of an electronic circuit required for its operation. The housing 4 is made of molded or extruded plastic. The elongated housing is shaped like a "clam" with a hinge 271 and a clasp 28 which clamps onto the power line 2. As illustrated in FIG. 7C, a fiber optic cable 19 is connected to the transceiver 3, which has a patch antenna 20. As further shown in FIG. 7D and FIG. 7E, the transceiver 3 is mounted on the vault cover with the patch antenna 20.

With reference to FIG. 8 and FIG. 9, the overhead and underground fault sensor devices 1 and 17 are capable of both receiving and transmitting signals, as well as sensing the values of various parameters associated with the respective power line 2 upon which the sensor device is mounted. Although other types of communications links may be utilized, the invention is described herein as comprising of RF transmitting and receiving means in each of the fault sensors and in a ground station at a designated location 29. A ground station communication equipment antenna 30 is used to transmit and receive information. All fault sensors transmit data on a single frequency channel for reception by the ground station antenna 30. Signals from the ground station antenna 30 are transmitted on a second channel for reception by the fault sensor transceiver 3 in a manner similar to that described in U.S. Pat. No. 4,855,671, incorporated herein by reference.

Each of the devices is equipped to measure the absolute value of current and may, if desired, be further equipped to measure other parameters. When a fault occurs on a particular power line 2 which may have several sensing devices, several signals will be sent to provide the alarm information.

In order to reduce the probability of data collision, each sensing device is programmed individually to stagger the alarm report. The staggered transmission algorithm is based on the sensing device's identification.

FIG. 8 illustrates how the sensors interact with the load center or any designated ground station 29. It is realistic to expect that up to a hundred sensor devices can communicate with one ground station 29 at a designated location. As illustrated in FIG. 9, at the designated location there is an antenna 30 with either a transceiver or a SCADA RTU 23 which receives the information from the devices. The information it receives includes the sensor identification, and alarm or fault condition. The ground station 29 will also receive a sensor device status report on a predetermined regular schedule from each sensor device as to the device's functionality. During this reporting interval, the sensor device can also be reprogrammed.

It will be appreciated by those of ordinary skill in the art that the present invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A method of distinguishing between a plurality of different types of faults using a fault sensor that monitors current of an AC power transmission or distribution line, comprising the steps of:

a) detecting when the current exceeds a first predetermined threshold level;

b) at a first predetermined time after the current has been detected as exceeding the predetermined threshold level, checking to see if said current is zero;

c) if the current at said first predetermined time is not zero, checking to see if the current is less than a second predetermined threshold level;

d) if the current at said first predetermined time is zero, at a second predetermined time after the current has been detected as exceeding the predetermined threshold level, checking to see if the current is zero;

e) if in Step c) the current is less than the second predetermined threshold level, indicating a current inrush type of fault;

f) if in Step c) the current is not less than the second predetermined threshold level, indicating a current overload type of fault;

g) if in Step d) the current is zero, indicating a sustained current outage type of fault and further identifying the fault as being one of a line-to-ground fault, a line-to-line fault, or a three phase fault;

h) if in Step d) the current is not zero, indicating a momentary current outage type of fault and identifying the fault as one of a line-to-ground fault, a line-to-line fault or a three phase fault.

* * * * *